United States Patent
Agarwal et al.

(10) Patent No.: US 10,073,351 B2
(45) Date of Patent: Sep. 11, 2018

(54) SEMI-AQUEOUS PHOTORESIST OR SEMICONDUCTOR MANUFACTURING RESIDUE STRIPPING AND CLEANING COMPOSITION WITH IMPROVED SILICON PASSIVATION

(71) Applicant: AIR PRODUCTS AND CHEMICALS, INC., Allentown, PA (US)

(72) Inventors: Rajiv Krishan Agarwal, Malvern, PA (US); Mark Richard Brown, Schnecksville, PA (US); Aiping Wu, Macungie, PA (US); David Barry Rennie, Bethlehem, PA (US); Yi-Chia Lee, Chupei (TW); Gene Everad Parris, Coopersburg, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 14/964,033

(22) Filed: Dec. 9, 2015

(65) Prior Publication Data
US 2016/0179011 A1   Jun. 23, 2016

Related U.S. Application Data

(60) Provisional application No. 62/095,857, filed on Dec. 23, 2014.

(51) Int. Cl.
| | |
|---|---|
| C11D 7/32 | (2006.01) |
| G03F 7/42 | (2006.01) |
| C11D 11/00 | (2006.01) |
| C11D 7/26 | (2006.01) |
| H01L 21/02 | (2006.01) |

(52) U.S. Cl.
CPC .............. *G03F 7/425* (2013.01); *C11D 7/261* (2013.01); *C11D 7/265* (2013.01); *C11D 7/267* (2013.01); *C11D 7/3209* (2013.01); *C11D 7/3218* (2013.01); *C11D 7/3281* (2013.01); *C11D 11/0047* (2013.01); *G03F 7/423* (2013.01); *G03F 7/426* (2013.01); *H01L 21/02057* (2013.01); *H01L 21/02334* (2013.01)

(58) Field of Classification Search
CPC .................................................. C11D 11/0047
USPC ........................................................ 510/175
See application file for complete search history.

(56) References Cited

U.S. PATENT DOCUMENTS

| | | | |
|---|---|---|---|
| 4,490,181 A | 12/1984 | McCready | |
| 5,230,833 A | 7/1993 | Romberger et al. | |
| 5,417,877 A | 5/1995 | Ward | |
| 5,563,119 A | 10/1996 | Ward | |
| 5,928,430 A | 7/1999 | Ward et al. | |
| 6,218,087 B1 | 4/2001 | Tanabe et al. | |
| 6,508,887 B1 | 1/2003 | Park et al. | |
| 7,591,270 B2 | 9/2009 | Zhang et al. | |
| 2002/0025762 A1 | 2/2002 | Luo et al. | |
| 2003/0032832 A1 | 2/2003 | Shahid | |
| 2005/0119143 A1* | 6/2005 | Egbe ................. | C11D 3/0073 510/175 |
| 2007/0060490 A1* | 3/2007 | Skee .................. | C11D 3/0073 510/175 |
| 2008/0004193 A1 | 1/2008 | Lee | |
| 2009/0082240 A1 | 3/2009 | Nukui et al. | |
| 2009/0120457 A1 | 5/2009 | Naghshineh et al. | |
| 2012/0048295 A1* | 3/2012 | Du ..................... | C11D 7/3245 134/3 |
| 2013/0061882 A1 | 3/2013 | Wu et al. | |

FOREIGN PATENT DOCUMENTS

| | | |
|---|---|---|
| CN | 1924710 A | 3/2007 |
| EP | 1128222 A2 | 8/2001 |
| EP | 2281867 A1 | 2/2011 |
| EP | 2500407 A1 | 9/2012 |
| EP | 2687589 A2 | 1/2014 |
| KR | 20070025444 A | 3/2007 |
| KR | 201330045011 A | 5/2013 |
| WO | 9934940 | 7/1999 |

OTHER PUBLICATIONS

Seidel, H., Anisotropic Etching of Crystalline Silicon in Alkaline Solutions, J. Electrochem. Soc., vol. 137, No. 11, Nov. 1990, pp. 3612-3626.
Linde, H. and Austin, L., Wet Silicon Etching with Aqueous Amine Gallates, J. Electrochem. Soc., vol. 139, No. 4, Apr. 1992, pp. 1170-1174.

\* cited by examiner

*Primary Examiner* — Gregory Webb
(74) *Attorney, Agent, or Firm* — Anne B. Kiernan

(57) ABSTRACT

A photoresist or semiconductor manufacturing residue stripping and cleaning composition comprising water, one or more alkaline compounds, one or more corrosion inhibitors, and one or more oxidized products of one or more antioxidants, the method of making the composition and the method of using the composition.

16 Claims, No Drawings

SEMI-AQUEOUS PHOTORESIST OR SEMICONDUCTOR MANUFACTURING RESIDUE STRIPPING AND CLEANING COMPOSITION WITH IMPROVED SILICON PASSIVATION

This invention claims priority to U.S. 62/095,857 filed Dec. 23, 2014 having the same title which is fully incorporated herein by reference.

BACKGROUND OF THE INVENTION

This invention relates to an improvement in semi-aqueous stripping compositions particularly useful for stripping photoresists, photoresist residues, and other residues from silicon wafers.

During manufacture of semiconductors and semiconductor microcircuits, it is frequently necessary to coat the substrates from which the semiconductors and microcircuits are manufactured with a polymeric organic film, generally referred to as a photoresist, e.g., a substance which forms an etch resist upon exposure to light. These photoresists are used to protect selected areas of the surface of the substrate, while the etchant selectively attacks the unprotected area of the substrate. The substrate is typically a silicon dioxide coated silicon wafer and may also contain metallic microcircuitry, such as aluminum, copper, tungsten, titanium, tantalum, and metal alloys and nitrides, on the surface. Following completion of the etching operation and washing away of the residual etchant, it is necessary that the resist be removed from the protective surface to permit essential finishing operations. It is desirable to develop an improved stripping and cleaning composition to remove the organic polymeric substrate from a coated inorganic substrate without corroding, dissolving or dulling the metal circuitry and without removing the silicon wafer material either. The silicon wafer may be exposed to the photoresist stripping and cleaning composition (also referred to herein as "stripper" or "cleaning composition" or "stripping and cleaning composition") during the application of the first layers of circuitry onto the front side of the wafer, where grippers are used to handle the wafer, and on the backside of the wafer. Typically the exposed portions of the silicon wafer are passive to stripping cleaning compositions. However, in some cases, the exposed silicon may get etched by photoresist strippers, particularly high pH strippers. These strippers may contain amines, quaternary bases, and mixtures thereof. It is therefore desirable to provide an improved stripper that does not etch the silicon wafer and instead, provides improved silicon passivation.

BRIEF SUMMARY OF THE INVENTION

This invention provides a suitable stripping and cleaning composition in which the hereinbefore mentioned disadvantages or drawbacks of corrosion are eliminated or substantially reduced. The invention provides for decreased etching of the exposed portions (e.g. the backside) of the silicon wafer. In one aspect this invention is provided a photoresist stripping and cleaning composition comprising water and one or more alkaline compound, at least one corrosion inhibitor, and one or more oxidized fractions (also referred to herein as oxidized products) of one or more antioxidants. In another aspect of the invention the one or more alkaline compounds of the invention may comprise one or more amines or one or more quaternary ammonium hydroxides or combinations thereof. In the composition of this invention, alone or with other aspects of the invention, the one or more corrosion inhibitors may comprise one or more antioxidant corrosion inhibitors. The composition of this invention, alone or with additional aspects of this invention may comprise one or more oxidized products of one or more antioxidants which are formed by oxidizing one or more antioxidant corrosion inhibitors. In one aspect of the invention, alone or in combination with other aspects of the invention, the one or more oxidized products of one or more antioxidants were formed in situ by adding oxygen-containing gas, peroxides or nitrates to said composition or by bubbling oxygen-containing gas through said composition. In another aspect of the invention, the composition, alone or with other aspects comprises, the one or more antioxidant corrosion inhibitors selected from the group consisting of catechol, t-butyl catechol, resorcinol, pyrogallol, gallic acid, esters of gallic acid and ascorbic acid, or may be selected from gallic acid and catechol. In another aspect of the invention, the composition, alone or with other aspects, comprises or further comprises one or more passivation corrosion inhibitors. In another aspect of the invention, the one or more alkaline compounds in said composition of the invention, alone or with other aspects, are selected from the group comprising one or more amines or one or more quaternary ammonium hydroxides or mixtures of one or more amines or one or more quaternary ammonium hydroxides. In another aspect of the invention, the composition of this invention, alone or with any of the other aspects of this invention may have one or more passivation corrosion inhibitors that may be selected from the group consisting of a triazole, and weak acids having a pH ranging from about 4 to about 7 or may be selected from the group consisting of anthranilic acid, benzoic acid, isophthalic acid, maleic acid, fumaric acid, D,L-malic acid, malonic acid, phthalic acid, maleic anhydride, phthalic anhydride, benzotriazole (BZT), carboxybenzotriazole, diethyl hydroxylamine, lactic acid and citric acid salts thereof, pyrogallol, fructose, ammonium thiosulfate, glycine, lactic acid, tetramethylguanidine, iminodiacetic acid, and dimethylacetoacetamide, trihydroxybenzene, dihydroxybenzene, and salicylhydroxamic acid.

In another aspect of the invention, the composition of this invention, alone or with any additional aspects of this invention, may have one or more amines selected from the group consisting of hexyl amine, 5-amino-2-methyl pentane, heptyl amine, octyl amine, nonyl amine, decyl amine, dipropyl amine, diisopropyl amine, dibutyl amine, diisobutyl amine, di-n-butyl amine, di-t-butyl amine, dipentyl amine, dihexyl amine, diheptyl amine, dioctyl amine, dinonyl amine, didecyl amine, amyl methyl amine, methyl isoamyl amine, tripropyl amine, tributyl amine, tripentyl amine, dimethyl ethyl amine, methyl diethyl amine, methyl dipropyl amine, N-ethylidene methyl amine, N-ethylidene ethyl amine, N-ethylidene propyl amine, N-butyl amine ethylidene, alkanolamines, ethanolamine, N-methyl ethanolamine, N-ethyl ethanolamine, N-propyl ethanolamine, N-butyl ethanolamine, diethanolamine, 1-amino-2-propanol, N-methyl amine isopropanol, N-ethyl-isopropanol amine, N-propyl isopropanol amine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutan-1-ol, N-methyl-2-aminobutane-1-ol, N-ethyl-2-aminobutane-1-ol, N-hydroxy-methyl ethanol amine, N-hydroxymethyl ethylene diamine, N,N'-bis (hydroxymethyl) ethylene diamine, N-hydroxymethyl propanol amine, ethylene diamine, propylene diamine, trimethylene diamine, tetramethylene diamine, 1,3-diaminobutane, 2,3-diaminobutane, pentamethylene diamine, 2,4-diamino pentane, hexamethylene diamine, heptamethylene diamine, octamethylene diamine, nonamethylene diamine, N-methyl ethylene diamine, N,N-dimethyl ethylene diamine, trimethyl ethylene diamine, N-ethyl ethylene diamine, N,N-diethyl ethylene diamine, triethyl ethylene diamine, 1,2,3-triaminopropane, hydrazine, tris (2-aminoethyl) amine, tetra (aminomethyl) methane, diethylene triamine, triethylene tetramine, tetraethyl pentamine, heptaethylene octamine, nonaethylene decamine, diazabicyclo undecene, hydroxylamine, N-methyl hydroxylamine, N-ethyl hydroxylamine, and N,N-diethyl hydroxylamine morpholine, or selected from the group consisting of primary, secondary and tertiary alkanolamines having from 1 to 5 carbon atoms.

In another aspect of the invention, the composition of this invention, alone or with any of the additional aspects of this invention, may have as the alkaline compound one or more alkanolamines selected from the group consisting of N-methylethanolamine (NMEA), monoethanolamine (MEA), diethanolamine, mono-, di- and triisopropanolamine, 2-(2-aminoethylamino) ethanol, 2-(2-aminoethoxy) ethanol, triethanolamine or the one or more alkaline compounds may be selected from the group morpholine, cyclohexylamine, piperidine alkylamines (the alkyl having 1 to 5 carbons), and alkylene diamines (having 1 to 5 carbons) or mixtures thereof or the one or more alkalines may be one or more amines selected from the group consisting of alkanolamines and hydroxylamines, or mixtures of alkanolamines and hydroxylamines.

In another aspect of the invention, the composition of this invention, alone or with additional aspects of this invention may comprise one or more quaternary ammonium hydroxides selected from the group consisting of compounds having the formula $[N-R_1R_2R_3R_4]^+OH^-$ wherein $R_1$, $R_2$, $R_3$, and $R_4$ are each independently an alkyl group, a hydroxyalkyl group, and combinations thereof, where said alkyl group is a straight or branched chain hydrocarbon groups having 1 to 20 carbon atoms and where said hydroxyalkyl group is a straight or branched hydroxyl group containing hydrocarbon groups of from 1 to 20 carbon atoms, or selected from the group consisting of tetramethylammounium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide.

In another aspect of the invention, the composition of this invention, alone or with any additional aspects of this invention may have 5 to 50 wt %, or 5 to 30 wt %, or 10 to 40 wt %, or 10 to 30 wt %, or 15 to 25 wt % of said water. The composition of this invention, alone or with any additional aspects of this invention may have 35 to 94.5 wt %, or 30 to 80 wt %, or 45 to 90 wt %, or 55 to 85 wt %, or 50 to 80 wt %, or 70 to 85% by weight of said one or more alkaline compounds. The composition of this invention, alone or with additional aspects of this invention may have 0.1 to 15 wt % or 0.5 to 10 wt % or 0.5 to 7 wt % or 0.5 to 5 wt % of said one or more corrosion inhibitors. The composition of this invention, alone or with any additional aspects of this invention may have 0.001 to 5 wt %, or 0.001 to 3 wt %, or 0.002 to 0.5 wt %, or 0.003 to 0.8 wt %, or 0.003 to 0.3 wt %, or 0.004 to 0.2 wt %, or 0.005 to 0.1 wt %, or 0.007 to 0.1 wt %, or 0.01 to 5 wt %, or 0.01 to 3 wt %, or 0.02 to 0.5 wt %, or 0.03 to 0.8 wt %, or 0.03 to 0.3 wt %, or 0.04 to 0.2 wt %, or 0.05 to 0.1 wt % of said one or more oxidation products of one or more antioxidants.

In another aspect of the invention, the composition of this invention, alone or with any of the additional aspects of this invention, may have about 0.1 to 10%, or about 0.5 to 3 wt %, or about 0.5 to 5%, or about 0.5 to 2.5% by weight of one or more passivation corrosion inhibitors and about 0.1 to 10%, or about 0.5 to 5%, or about 0.5 to 2.5% by weight of one or more antioxidant corrosion inhibitors. The composition of this invention, alone or with additional aspects of this invention, may further comprise one or more passivation corrosion inhibitors.

In an additional aspect of the invention, alone or with additional aspects, is provided a photoresist or semiconductor manufacturing residue stripping and cleaning composition comprising about 70 to 85% by weight of said one or more alkaline compounds wherein said alkaline compound comprises one or more alkanolamines, optionally about 0.5 to 2.5% by weight of one or more passivation corrosion inhibitors, about 0.5 to 2.5% by weight of one or more antioxidant corrosion inhibitors, 0.001 to 1% or 0.005 to 1%, or 0.01 to 1% of one or more oxidation products of one or more antioxidants, and 9.9 to 28.99 wt. % water.

In an additional aspect of the invention, alone or with additional aspects, is provided a photoresist or semiconductor manufacturing residue stripping and cleaning composition having one or more passivation corrosion inhibitors comprising benzatriozole and the one or more antioxidant corrosion inhibitors comprising gallic acid or catechol. In an additional aspect of the invention, alone or with additional aspects, is provided a cleaning composition wherein said one or more alkanolamines comprises N-methyl ethanolamine.

In an additional aspect of the invention, alone or with additional aspects, is provided a process for removing a photoresist or residue on a silicon substrate, the process comprising the steps of: contacting said substrate with a stripping and cleaning effective amount of any of the cleaning compositions of this invention; permitting said stripping composition to contact said substrate for a stripping effective period of time; and removing the photoresist or the photoresist residues from said substrate. The process may etch silicon at a rate that is less than 1 Å/min.

In an additional aspect of the invention, alone or with additional aspects, is provided a process of making any of the cleaning compositions of this invention, comprising the steps of combining water, one or more alkaline compounds, one or more antioxidant corrosion inhibitors in a container and adding oxygen-containing gas, peroxides or nitrates to said composition to form one or more oxidized products of antioxidant in said composition. The oxidized products of antioxidant may be the oxidized products of the antioxidant corrosion inhibitors. Those process steps may be performed prior to contacting the cleaning composition with a silicon substrate to be cleaned. The adding step may be performed by bubbling oxygen-containing gas through said composition in said container. Additional aspects of the compositions, method of using and method of making the composition of this invention are within the specification and within the claims at the end of the specification.

The stripping and cleaning compositions of the invention may provide an effective stripping and cleaning action as well as enhanced silicon passivation. Further the cleaning compositions of this invention may be or may provide one or more of the following benefits: non-corroding stripping and cleaning compositions that are effective at residue, polymer and contamination removal and/or are non-corrosive especially of aluminum, copper, tungsten, titanium, tantalum, and metal alloys and nitrides, and that provide a low or negligible silicon etch rate. Although the compositions of this invention were formulated primarily for removing photoresist and photoresist residues, it is understood that they can also be used to remove other residues from semiconductor components especially when silicon passivation is desired, such as, during the packaging steps for integrated circuits. Other objects and advantages of the present invention will be more fully understood in view of the accompanying description of the preferred embodiments.

DETAILED DESCRIPTION OF THE INVENTION

The stripping and cleaning compositions of the invention preferably comprise a mixture of water, one or more alkaline compounds, at least one corrosion inhibitor, and one or more oxidized fractions of one or more antioxidants. The alkaline compounds may be one or more amines or one or more quaternary ammonium hydroxides, or mixtures of one or more amines and one or more quaternary ammonium hydroxides. The one or more amines may be or may comprise one or more organic amines or one or more inorganic amines.

The compositions of the invention may comprise 5 to 50 wt %, or 10 to 40 wt %, or 5 to 30 wt %, or 10 to 30 wt %, or 15 to 25 wt % water; and 35 to 94.5 wt %, or 30 to 80 wt %, or 45 to 90 wt %, or 55 to 85 wt %, or 50 to 80 wt %, or 70 to 85 wt % of one or more alkaline compounds; and 0.1 to 15 wt %, or 0.5 to 3 wt %, or 0.5 to 10 wt %, or 0.5 to 7 wt %, or 0.5 to 5 wt % of one or more corrosion inhibitors; and 0.001 to 5 wt %, or 0.001 to 3 wt %, or 0.002 to 0.5 wt %, or 0.003 to 0.3 wt %, or 0.004 to 0.2 wt %, or 0.005 to 0.1 wt %, or 0.007 to 0.1 wt %, 0.01 to 5 wt %, or 0.01 to 3 wt %, or 0.02 to 0.5 wt %, or 0.03 to 0.3 wt %, or 0.04 to 0.2 wt %, or 0.05 to 0.1 wt % of one or more oxidation products of antioxidant. Note, all of the weight percentages described in this application are based on the total weight of the composition, unless otherwise indicated. (The one or more corrosion inhibitors in the amounts just defined may comprise, consist essentially of or consist of: one or more antioxidant corrosion inhibitors, one or more passivation corrosion inhibitors or a combination of one or more antioxidant corrosion inhibitors and one or more passivation corrosion inhibitors.) Note that the use of "one or more" means and could be replaced with: "one or more than one" throughout this application. When the one or more corrosion inhibitors comprise one or more antioxidant corrosion inhibitors and one or more passivation corrosion inhibitors, any of the compositions described herein may comprise 0.1 to 10 wt % of one or more passivation corrosion inhibitors and 0.1 to 10 wt % of one or more antioxidant corrosion inhibitors; or 0.5 to 5 wt % of one or more passivation corrosion inhibitors and 0.5 to 5 wt % of one or more antioxidant corrosion inhibitors; or 0.5 to 2.5 wt % of one or more passivation corrosion inhibitors and 0.5 to 2.5 wt % of one or more antioxidant corrosion inhibitors.

Any corrosion inhibitor known in the art for similar applications, such as those disclosed in U.S. Pat. No. 5,417,877 which are incorporated herein by reference may be used in the cleaning compositions of this invention. Corrosion inhibitors may be, for example, an organic acid, an organic acid salt, a phenol or a triazole. Examples of particular corrosion inhibitors include anthranilic acid, gallic acid, benzoic acid, isophthalic acid, maleic acid, fumaric acid, D,L-malic acid, malonic acid, phthalic acid, ascorbic acid, maleic anhydride, phthalic anhydride, benzotriazole (BZT), resorcinol, carboxybenzotriazole, and the like. Further examples of corrosion inhibitors that may be used include catechol, t-butyl catechol, pyrogallol, and esters of gallic acid. Yet other examples of suitable corrosion inhibitors include fructose, ammonium thiosulfate, glycine, lactic acid, tetramethylguanidine, iminodiacetic acid, and dimethylacetoacetamide. In certain embodiments, the corrosion inhibitor may include a weak acid having a pH ranging from about 4 to about 7. Examples of weak acids include trihydroxybenzene, dihydroxybenzene, and/or salicylhydroxamic acid.

The above-listed corrosion inhibitors include two types of corrosion inhibitors: passivation corrosion inhibitors and antioxidant corrosion inhibitors. Passivation corrosion inhibitors protect the metal features by complexing with metals to form a passive layer on top of the metal which is insoluble in aqueous and organic solutions. Antioxidant corrosion inhibitors protect metal features by removing dissolved oxygen from the stripping and cleaning solution to prevent metal oxidation formation and dissolution.

In certain embodiments of the cleaning composition, the one or more antioxidant corrosion inhibitors may be used in combination with: the oxidation product of that one or more antioxidant corrosion inhibitors, or the one or more oxidation products of one or more different antioxidant corrosion inhibitors as the oxidation product of one or more antioxidants. Stated differently, the oxidation product of one or more antioxidants in the cleaning composition may comprise the oxidation product of one or more antioxidant corrosion inhibitors present in the cleaning composition.

Examples of antioxidant corrosion inhibitors include catechol, t-butyl catechol, resorcinol, pyrogallol, gallic acid, esters of gallic acid, ascorbic acid, preferably gallic acid and catechol.

Examples of passivation corrosion inhibitors include a triazole, anthranilic acid, citric acid, benzoic acid, phthalic acid, isophthalic acid, maleic acid, fumaric acid, D,L-malic acid, malonic acid, maleic anhydride, phthalic anhydride, benzotriazole (BZT), carboxybenzotriazole, fructose, ammonium thiosulfate, glycine, tetramethylguanidine, iminodiacetic acid, salicylhydroxamic acid, and dimethylacetoacetamide.

The total amount of the corrosion inhibitor or inhibitors present in the cleaning compositions of this invention may be from 0.1 to 15 wt %, or 0.5 to 10 wt %, or 0.5 to 7 wt %, or 0.5 to 5 wt %. In some embodiments, the one or more antioxidant corrosion inhibitors may be present in those amounts alone or in combination with one or more passivation corrosion inhibitors.

Water is present in the cleaning compositions of this invention. The water is DI water or ultra high purity water. Water may be present in an amount from 5 to 50 wt %, or 10 to 40 wt %, or 5 to 30 wt %, or 10 to 30 wt % or 15 to 20 wt % based on the total weight of the composition.

The stripping and cleaning composition of this invention may comprise one or more soluble amines as the alkaline compound therein. Specific examples include hexyl amine, 5-amino-2-methyl pentane, heptyl amine, octyl amine, nonyl amine, decyl amine, dipropyl amine, diisopropyl amine, dibutyl amine, diisobutyl amine, di-n-butyl amine, di-t-butyl amine, dipentyl amine, dihexyl amine, diheptyl amine, dioctyl amine, dinonyl amine, didecyl amine, amyl methyl amine, methyl isoamyl amine, tripropyl amine, tributyl amine, tripentyl amine, dimethyl ethyl amine, methyl diethyl amine, methyl dipropyl amine, N-ethylidene methyl amine, N-ethylidene ethyl amine, N-ethylidene propyl amine, N-butyl amine ethylidene, alkanolamines, ethanolamines, N-methyl ethanolamine, N-ethyl ethanolamine, N-propyl ethanolamine, N-butyl ethanolamine, diethanolamine, 1-amino-2-propanol, N-methyl amine isopropanol, N-ethylisopropanol amine, N-propyl isopropanol amine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutan-1-ol, N-methyl-2-aminobutane-1-ol, N-ethyl-2-aminobutane-1-ol, N-hydroxy-methyl ethanol amine, N-hydroxymethyl ethylene diamine, N,N'-bis (hydroxymethyl) ethylene diamine, N-hydroxymethyl propanol amine, ethylene diamine, propylene diamine, trimethylene diamine, tetramethylene diamine, 1,3-diaminobutane, 2,3-diaminobutane, pentamethylene diamine, 2,4-diamino pentane, hexamethylene diamine, heptamethylene diamine, octamethylene diamine, nonamethylene diamine, N-methyl ethylene diamine, N,N-dimethyl ethylene diamine, trimethyl ethylene diamine, N-ethyl ethylene diamine, N,N-diethyl ethylene diamine, triethyl ethylene diamine, 1,2,3-triaminopropane, hydrazine, tris (2-aminoethyl) amine, tetra (aminomethyl) methane, diethylene triamine, triethylene tetramine, tetraethyl pentamine, heptaethylene octamine, nonaethylene decamine, diazabicyclo undecene, hydroxylamine, N-methyl hydroxylamine, N-ethyl hydroxylamine, N,N-diethyl hydroxylamine, morpholine.

One or more alkanolamines may be used as the alkaline compound in the invention, particularly, the alkanolamines which are primary, secondary and tertiary having from 1 to 5 carbon atoms, as listed above, including N-methylethanolamine (NMEA), monoethanolamine (MEA), diethanolamine, mono-, di- and triisopropanolamine, 2-(2-aminoethylamino) ethanol, 2-(2-aminoethoxy) ethanol, triethanolamine, and the like.

Other organic amines which can be used as the alkaline compound in the composition of this invention include cyclic non-aromatic amines such as morpholine, cyclohexylamine, and piperidine, alkylamines having 1 to 5 carbon atoms such as butylamine, alkylene diamines having 1 to 5 carbon atoms such as ethylene diamine, and the like.

The preferred amines that may be used as the one or more alkaline compounds in the compositions of this invention are alkanolamines and hydroxylamines or mixtures of alkanolamines and hydroxylamines.

The one or more amines used as the one or more alkaline compounds in the composition of this invention may be present in a total amount from 35 to 94.5 wt %, or 30 to 80 wt %, or 45 to 90 wt %, or 55 to 85 wt %, or 50 to 80 wt %, or 75 to 85 wt % based on the total weight of the composition.

The stripping and cleaning compositions of this invention may comprise one or more soluble quaternary ammonium hydroxide compounds as the alkaline compound or a portion of the alkaline compound present in the composition. Exemplary quaternary ammonium hydroxides may be those compounds having the formula $[N—R_1R_2R_3R_4]^+OH^-$ wherein $R_1$, $R_2$, $R_3$, and $R_4$ are each independently an alkyl group, a hydroxyalkyl group, and combinations thereof. The term "alkyl" as used herein refers to straight or branched chain hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The term "hydroxyalkyl" as used herein refers to straight or branched hydroxyl groups containing hydrocarbon groups of from 1 to 20 carbon atoms, or from 1 to 8 carbon atoms, or from 1 to 4 carbon atoms. Examples of suitable hydroxylalkyl groups include hydroxylethyl and hydroxypropyl. Examples of suitable quaternary ammonium hydroxide compounds include tetramethylammounium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide, or mixtures thereof.

The one or more quaternary ammonium hydroxides used as the one or more alkaline compounds in the composition of this invention may be present in a total amount from 35 to 94.5 wt %, or 50 to 80 wt %, or 45 to 90 wt %, or 55 to 85 wt %, or 50 to 80 wt %, or 70 to 85 wt % based on the total weight of the composition.

The pH of the composition may be greater than 7, typically greater than 8, or greater than 9, or from 9 to 12, or from 10 to 12.

One preferred photoresist stripping and cleaning composition comprises about 70 to 85 wt % of one or more alkaline compounds, about 0.5 to 2.5 wt % of one or more antioxidant corrosion inhibitors, about 0.001 to 0.1 wt %, or 0.005 to 0.1 wt %, or 0.01 to 0.1 wt % of one or more oxidized fractions of one or more antioxidants, and about 12.4 to 29.49 wt % water.

Another preferred photoresist stripping and cleaning composition comprises about 70 to 85 wt % of one or more alkaline compounds, about 0.5 to 2.5 wt % of one or more passivation corrosion inhibitors, about 0.5 to 2.5 wt % of one or more antioxidant corrosion inhibitors, about 0.01 to 0.1 wt % of one or more oxidized fractions of one or more antioxidants and about 9.9 to 28.99 wt % water. In one embodiment, the one or more alkaline compounds may comprise one or more alkanolamines. In one embodiment, which may be in combination with the embodiment comprising the one or more alkanolamines, the passivation corrosion inhibitor may comprise benzatriazole. In another embodiment, the antioxidant corrosion inhibitor may comprise gallic acid, which may be in combination with one or more alkanolamines and benzatriazole. Another preferred cleaning composition comprises alkanolamine, for example, N-methyl ethanolamine, benzotriazole, gallic acid, gallic acid oxide and water.

One preferred photoresist stripping and cleaning composition comprises about 70 to 85 wt % of alkanolamine, for example, N-methyl ethanolamine, about 0.5 to 2.5 wt % of benzotriazole, about 0.5 to 2.5% by weight of gallic acid, about 0.01 to 0.1 wt % percent of gallic acid oxide and about 9.9 to 28.99 wt % water.

One preferred photoresist stripping and cleaning composition comprises about 70 to 85 wt % of one or more alkaline compounds, about 0.5 to 10 wt % of one or more antioxidant corrosion inhibitors, about 0.01 to 1 wt % of one or more oxidized fractions of one or more antioxidants, and about 4 to 29.49 wt % water.

Another preferred photoresist stripping and cleaning composition comprises about 70 to 85 wt % of one or more alkaline compounds, about 0.5 to 2.5 wt % of one or more passivation corrosion inhibitors, about 0.5 to 7 wt % of one or more antioxidant corrosion inhibitors, about 0.01 to 0.7 wt % of one or more oxidized fractions of one or more antioxidants and about 4.8 to 28.99 wt % water.

In one embodiment, the one or more alkaline compounds may comprise one or more alkanolamines or one or more alkanolamines and hydroxylamine. In one embodiment, which may be in combination with the embodiment comprising the one or more alkanolamines, or one or more alkanolamines and hydroxylamine, the passivation corrosion inhibitor may comprise benzatriazole. In another embodiment, the antioxidant corrosion inhibitor may comprise gallic acid or catechol or mixtures of gallic acid and catechol, which may be in combination with one or more alkanolamines and/or hydroxylamines and/or benzatriazole. Another preferred cleaning composition comprises alkanolamine, for example, N-methyl ethanolamine, or methyl ethanolamine, benzotriazole, gallic acid, gallic acid oxide and water. Another preferred cleaning composition comprises alkanolamine and hydroxylamine, water and either catechol and oxidation product of catechol, or gallic acid and gallic acid oxide.

One preferred photoresist stripping and cleaning composition comprises about 70 to 85 wt % of an alkanolamine and hydroxylamine, about 0.5 to 7 wt % catechol and/or gallic acid, about 0.001 to 0.7 wt % or 0.005 to 0.7 wt % or 0.01 to 0.7 wt % percent of an oxidation product of catechol and/or gallic acid and about 7.3 to 29.49 wt % water.

Note it is understood herein, that any reference to a single component includes the possibility of a plurality of that component and any reference to the plural includes the possibility of a single component in the compositions, the methods of using and the method of making those compositions described herein.

One way to provide a composition of this invention comprising the one or more oxidized fractions of antioxidants therein is to bubble, inject or otherwise introduce an oxygen containing fluid (it may be a gas or a liquid) into or through a cleaning composition of this invention that comprises one or more antioxidant corrosion inhibitors. If the oxidized fractions of antioxidants is made by injecting an oxygen containing fluid into the cleaning composition, also referred to as in situ, it is preferred that less than 50 percent or less than 10 percent of the one or more antioxidant corrosion inhibitors present in the composition is converted to the oxidized fractions of antioxidants. Alternatively, the oxidized fractions of antioxidants may be purchased or made in a separate container or solution and added to the cleaning composition. Oxidants that can be used to create the oxidized fractions of antioxidants include, but are not limited to, an oxygen-containing gas or fluid, air, peroxides, nitrate compounds, e.g., nitrous oxide. Partial oxidation of the antioxidant can be accomplished by using an oxidant in a controlled manner. Process parameters that can be controlled include reaction temperature and pressure. Care must be taken to limit oxidation such that the desired level of partial oxidation is achieved. Partial oxidation of the cleaning composition is modest to ensure that cleaning composition and/or antioxidant corrosion inhibitor is not changed significantly to maintain the cleaning performance of the cleaning composition. It has been found that oxidation of <10% of the antioxidant corrosion inhibitor present in the cleaning composition (without oxidized fractions of antioxidants therein, but otherwise in accordance with this invention) typically yields enough oxidized fractions of antioxidants to impart silicon passivation to the cleaning composition. It is preferred that the oxidized products of one or more antioxidants be formed or otherwise added to the cleaning composition prior to contacting the cleaning composition to a silicon substrate that is to be cleaned.

The compositions of the invention described herein may further comprise optional components including organic solvents, and/or one or more additives, such as, surfactants and biocides, and others known to the industry, where these components are each or cumulatively present in an amount of less than 10 wt % or preferably less than 5 wt %.

The optional organic solvent used in the compositions of this invention may include one or mixtures of more than one water soluble or water miscible organic solvent. As used herein, water soluble or water miscible organic solvents include solvents that are able to mix with water and each other and form a homogeneous solution at standard temperature and pressure. Examples of water soluble or water miscible organic solvents that may be used include, but are not limited to, ethylene glycol, propylene glycol, dipropylene glycol, 1,4-butanediol, tripropylene glycol methyl ether, tripropylene glycol monobutyl ether, propylene glycol propyl ether, diethylene glycol n-butyl ether, hexyloxypropylamine, poly(oxyethylene)diamine, dimethylsulfoxide, tetrahydrofurfuryl alcohol, glycerol, alcohols (e.g. benyl alcohol), sulfoxides, or mixtures thereof. Preferred optional solvents are alcohols, diols, or mixtures thereof. Preferred optional solvents include glycol ethers or hydric alcohols having 2 to 8 carbon atoms, and mixtures thereof, for example.

Examples of glycol ethers that may be used as the optional solvent in the compositions of this invention include, for example, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monolisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, ethylene glycol monomethyl ether acetate, ethylene glycol monoethyl ether acetate, propylene glycol methyl ether acetate, propylene glycol monomethyl ether, propylene glycol dimethyl ether, propylene glycol monobutyl ether, propylene glycol monopropyl ether, dipropylene glycol monomethyl ether, dipropylene glycol monopropyl ether, dipropylene glycol monoisopropyl ether, dipropylene glycol monobutyl ether, dipropylene glycol diisopropyl ether, tripropylene glycol monomethyl ether, tripropylene glycol monobutyl ether, 1-methoxy-2-butanol, 2-methoxy-1-butanol, 2-methoxy-2-methylbutanol, 1,1-dimethoxyethane and 2-(2-butoxyethoxy) ethanol. In an exemplary embodiment, the glycol ether includes tri(propylene glycol) methyl ether (t-PGME).

One suitable monohydric alcohol having one hydroxy group, 2 to 8 carbon atoms, and optionally, a heterocyclic compound that may be used as the optional organic solvent in the compositions of this invention, includes tetrahydrofufuryl alcohol (THFA). THFA is particularly preferred because it is biodegradable and water-miscible with high solvency. Additionally, THFA is not listed as a carcinogen and is not classified as a hazardous waste.

The solvent, if present, functions primarily to dissolve the organic polymer in the resist layer or organic residues, thereby removing the resist layer or organic residues from the substrate.

The optional surfactants include any known surfactants and may be, for examples, anionic, cationic, nonionic and zwitterionic. Examples of surfactants include dodecyl sulfate sodium salts, sodium lauryl sulfates, dodecyl sulfate ammonium salts, secondary alkane sulfonates, acetylenic surfactants, alkyl phenol ethoxylates, fatty alcohol ethoxylates, fatty amine ethoxylates, propylene oxide-ethylene oxide block copolymers, or ethylene diamine surfactants, and any combination thereof. Examples of suitable commercially available surfactants include TRITON™, Tergitol™, DOWFAX™ family of surfactants manufactured by Dow Chemicals and various surfactants in SURFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals. Additional examples of some useful surfactants are disclosed in U.S. Pat. No. 7,591,270, incorporated herein by reference.

Optional biocides, useful to control bacterial and fungal growth during storage are disclosed in U.S. Pat. No. 5,230,833 and US Patent Application No. US 20020025762. Biological growth inhibitors disclosed include tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, and sodium hypochlorite. Some of the commercially available preservatives include KATHON™ and NEOLENE™ product families from Dow chemicals and Preventol™ family from Lanxess.

Some compositions of the invention described herein may be substantially free of fluorine containing compounds, and/or hydroxylamine and/or peroxide and/or additional organic solvents, and/or buffers, and/or one or more of the following additives, such as, surfactants and/or biocides where substantially free means less than 1 wt %, or less than 0.01 wt %, or preferably less than 0.005 wt %.

The stripping and cleaning compositions of this invention are useful and advantageous for numerous reasons among which were mentioned above and may include the following also. The stripping and cleaning compositions of this invention may be water soluble, non-corrosive, non-flammable and of low toxicity to the environment. The stripping and cleaning compositions may evidence higher stripping and cleaning efficiency at low temperatures for a wide variety of coatings and substrates while at the same time providing improved silicon passivation. They may be particularly suitable for removal of photoresists and residues from plasma processing used in integrated circuit fabrication.

The cleaning compositions are easily prepared by simply mixing the components, typically at room temperature. Alternatively, the components except for the oxidized fractions of antioxidants, can be mixed and, as described above, the oxidized fractions of antioxidants can be formed in situ, by bubbling air or other oxygen-containing fluids (e.g. gas) through the mixed components, or adding an oxidizing fluid to the composition, which then forms the oxidized fractions of antioxidants therein. In one embodiment 200 standard cubic centimeters per minute of air could be bubbled into 350 milliliters (ml) of the cleaning composition comprising one or more antioxidant corrosion inhibitors for at least 2 hours, or at least 3 hours, or at least 4 hours, or for 4-10 hours (and for each, its oxygen-introduced equivalent) to form the oxidized fractions of antioxidants in the cleaning composition. The amount of the cleaning composition, the times and the flow rates can easily be adjusted to introduce the same or a similar amount of oxygen into a same or similar volume of the composition to produce the same or similar amount of oxidized fractions of antioxidants, if a higher or lower percent oxygen containing fluid is bubbled through the cleaning composition and/or if a higher or lower flow rate of that fluid is introduced into the cleaning composition and/or if the amount of cleaning composition to be treated is increased. Reference to "or its oxygen-introduced equivalent" used above covers those different oxygen containing fluids that are introduced for different times to bubble or otherwise introduce the same amount of oxygen into the same or similar volumes of the composition as is introduced by bubbling 200 sccm into 350 ml of the cleaning composition for the times indicated above.

The method of using the cleaning composition of the invention is typically carried out by contacting an organic or metal-organic polymer, inorganic salt, oxide, hydroxide or complex or combination thereof as a film or residue, (i.e. sidewall polymer (SWP)) that is present on a silicon wafer, with the described stripping and cleaning composition. The actual conditions, i.e., temperature, time, etc. depend on the nature and thickness of the complex (photoresist and/or sidewall polymer and/or other residues) material to be removed, as well as other factors familiar to those skilled in the art. In general, for photoresist stripping and/or cleaning, the wafer comprising the photoresist to be cleaned can be contacted, sprayed or dipped into a vessel containing the cleaning composition at a temperature between 25 to 85° C., typically for a period of about 5 to 30 minutes typically, washed with water and then dried with an inert gas or "spin dried". For alternative embodiments, for example, cleaning package frames, the frames with attached wafers (pieces of wafers) may be contacted with the cleaning composition typically for 1 second to 30 minutes, as needed.

Examples of organic polymeric materials include photoresists, electron beam resists, X-ray resists, ion beam resists, and the like. Specific examples of organic polymeric materials include positive resists containing phenol formaldehyde type resins or poly (p-vinylphenol), polymethylmethacrylate-containing resists, and the like. Examples of plasma processing residues (sidewall polymer, also referred to as SWP) include among others; metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, boron phosphorous silicon glass (BPSG), aluminum, aluminum alloys, copper, copper alloys, titanium, tungsten, metal nitrides, etc.

Although not wishing to be bound by theory, it is believed that the oxidized fractions of antioxidants protect the silicon, which may be silicon backside, from etching presumably by making insoluble silicon complexes that prevent etching of silicon.

The effectiveness and unexpected nature of the cleaning compositions of the invention is illustrated, but not limited by, the data presented in the following examples. Unless otherwise specified, all parts and percentages are by weight.

Examples

In order to demonstrate the efficacy of the cleaning compositions of this invention the following tests were conducted. Cleaning Composition A was treated by the process of this invention to partially oxidize the antioxidant corrosion inhibitor. The process to partially oxidize the antioxidant corrosion inhibitor is as follows: The cleaning composition was prepared by mixing in a beaker at room temperature all of the components listed in Table 1, in the weight percents indicated therein. The alkaline compound used was an organic amine, specifically N-methylethanolamine (NMEA). The passivation corrosion inhibitor was benzotriazole. The antioxidant corrosion inhibitor used was gallic acid. The oxidation product of the antioxidant used was gallic acid oxide which was prepared in situ by reacting the composition with oxygen. (Alternatively gallic acid oxide could have been purchased commercially or it could have been made separately and added.) Formation of gallic acid oxide in situ was followed using a High-Pressure Liquid Chromatography with UV Detector (HPLC-UV). The final cleaning formulation had a composition as listed in Table 1. Silicon etch rates were obtained on Si<100> blanket wafers. Silicon etch rates were determined at 70° C. Four discrete pieces of silicon wafers were treated with Buffered Oxide Etch (BOE) solution to remove silicon dioxide layer on top and were dipped in the formulation at the given temperature and allowed to remain in contact for a predetermined amount of time. After the exposure, the wafers were rinsed with methyl pyrolidine and DI water solutions to remove organic solvent, dried and weight changes were measured to calculate silicon etch rates. Reported values in Table 1 are an average of four discrete measurements.

The Comparative cleaning composition did not contain the oxidation product of antioxidant, that is, the unoxidized cleaning composition, had significant etching of silicon. For Cleaning Composition A negligible etching of silicon was noted. Cleaning Composition A contained 0.055% by weight gallic acid oxide formed by in situ oxidation of the gallic acid (the antioxidant corrosion inhibitor) in the cleaning composition. Cleaning compositions having greater than or equal to 0.055% by weight oxidized product of antioxidant would be expected to provide low silicon etching rates.

Several other compositions were also tested. Each composition contained an antioxidant corrosion inhibitor. All the compositions were produced my mixing the components identified in Table 2 and described below at room temperature. The process to partially oxidize the antioxidant corrosion inhibitor (forming oxidized products of antioxidant corrosion inhibitor which is oxidized products of antioxidant) in each of the compositions was as follows: In a 500 ml beaker, 350 ml of each composition was poured and 200 standard cubic centimeters per minute (sccm) of air was sparged for a desired amount of time as listed in Table 2. After a preset time, air sparging was stopped and samples were stored in nitrogen. Later silicon etch rates for each composition at the various sparging times were determined. For silicon etch rates, four 3.5 cm×3.5 cm pieces of Si<100> pre-weighed pieces were used for each etch rate reported in Table 2. The silicon pieces were immersed in 350 ml of each cleaning composition with stirring at 70° C. and allowed to react for 6 hours. After 6 hours, the silicon pieces were removed, washed with isopropyl alcohol and deionized water and allowed to dry. Later, the silicon pieces were weighed and the difference between the pre-weighed weights and the after treatment weights and the etch rates per minute were calculated for each silicon piece. An average of the results for each set of the four pieces treated with the cleaning compositions sparged for the various times was calculated and reported in Table 2.

Composition B contained water, a mixture of 2(methyl amino) ethanol and hydroxylamine in the weight ratio of 3.3 as the alkaline, and catechol as the antioxidant corrosion inhibitor. Composition C contained water, a mixture of monoisopropanolamine and hydroxylamine in the weight ratio of 3.3 as the alkaline, and catechol as the antioxidant corrosion inhibitor. Composition D contained water, a mixture of monoethanolamine and hydroxylamine in the weight ratio of 3.4 as the alkaline, and catechol as the antioxidant corrosion inhibitor. Composition E contained water, a mixture of monoethanolamine and hydroxylamine in the weight ratio of 3.4 as the alkaline, and gallic acid as the antioxidant corrosion inhibitor. Composition F contained water, 2 (methylamino) ethanol as the alkaline, catechol as the antioxidant corrosion inhibitor and benzotriazole as the passivation corrosion inhibitor. (Note: In the cleaning compositions containing hydroxylamine, a 50% aqueous hydroxylamine solution was used. The amount of water in the cleaning composition was equivalent to the water present in the aqueous hydroxylamine solution used to make the cleaning composition.)

TABLE 1

Etch rate comparision

| Cleaning Composition | organic amine wt % | Water wt % | Passivation Corrosion Inhibitor wt % | antioxidant corrosion inhibitor wt % | oxidized product of antioxidant wt % | Si <100> etch Rate Å/min |
|---|---|---|---|---|---|---|
| Comparative | 78.00 | 20.00 | 1.00 | 1.000 | 0.000 | 93 |
| A | 78.00 | 20.00 | 1.00 | 0.941 | 0.055 | <1 |

TABLE 2

Etch rate comparision

| Composition | Time for Air Sparge | wt % Water | wt % alkaline | wt % Antioxidant corrosion inhibitor | wt %* Oxidation of Antioxidant corrosion inhibitor | wt % Passivation corrosion inhibitor | Si etch Rate A/min |
|---|---|---|---|---|---|---|---|
| B | 0 hour | 18.1 | 77.2 | 4.7 | | | 238 |
|   | 3 hour | | | | | | 1.3 |
|   | 5 hour | | | | ~0.1 | | 2.0 |
| C | 0 hour | 18.1 | 77.2 | 4.7 | | | 321 |
|   | 3 hour | | | | | | 0.4 |
|   | 5 hour | | | | ~0.1 | | 0.6 |
| D | 0 hour | 18.4 | 80.6 | 1.0 | | | 128 |
|   | 1 hour | | | | | | 280 |
|   | 3 hour | | | | | | 244 |
|   | 5 hour | | | | 1.00 | | 6.4 |
| E | 0 hour | 18.3 | 80.7 | 1.0 | | | Flaked |
|   | 1 hour | | | | | | Flaked |
|   | 3 hour | | | | | | Flaked |
|   | 5 hour | | | | 1.00 | | 1 |
| F | 0 hour | 19.5 | 78.5 | 1.0 | | 1.0 | 6.0 |
|   | 1 hour | | | | | | 5.1 |
|   | 3 hour | | | | | | 5.0 |
|   | 5 hour | | | | 9.8 | 1.0 | 3.7 |

*The wt % oxidation of the antioxidant corrosion inhibitor in Table 2 was determined by measuring the difference between the initial and final amounts of antioxidant corrosion inhibitor in each cleaning composition using liquid chromatography and dividing by the initial amount of the antioxidant corrosion inhibitor in the cleaning composition.

Note that the terms "comprising", "containing" or "having" are all non-limiting, open terms and include the partially closed or closed terms "consisting essentially of" and "consisting of" anywhere those terms are used in the application.

The invention claimed is:

1. A photoresist or semiconductor manufacturing residue stripping and cleaning composition, comprising about 70 to 85% by weight of one or more alkaline compounds wherein said alkaline compound comprises one or more alkanolamines, about 0.5 to 2.5% by weight of one or more antioxidant corrosion inhibitors, 0.001 to 1% of one or more oxidation products of one or more antioxidants, and 9.9 to 28.99 wt. % water.

2. The photoresist or semiconductor manufacturing residue stripping and cleaning composition of claim 1, wherein said one or more oxidized products of one or more antioxidants are formed by oxidizing said one or more antioxidant corrosion inhibitors.

3. The photoresist or semiconductor manufacturing residue stripping and cleaning composition of claim 1, wherein said one or more oxidized products of one or more antioxidants were formed in situ by adding oxygen-containing gas, peroxides or nitrates to said composition.

4. The photoresist or semiconductor manufacturing residue stripping and cleaning composition of claim 1, wherein said one or more antioxidant corrosion inhibitors are selected from the group consisting of catechol, t-butyl catechol, resorcinol, pyrogallol, gallic acid, esters of gallic acid and ascorbic acid.

5. The photoresist or semiconductor manufacturing residue stripping and cleaning composition of claim 1, further comprising one or more passivation corrosion inhibitors.

6. The photoresist or semiconductor manufacturing residue stripping and cleaning composition of claim 5, wherein said one or more passivation corrosion inhibitors are selected from the group consisting of anthranilic acid, benzoic acid, isophthalic acid, maleic acid, fumaric acid, D,L-malic acid, malonic acid, phthalic acid, maleic anhydride, phthalic anhydride, benzotriazole (BZT), carboxybenzotriazole, diethyl hydroxylamine, lactic acid and citric acid salts thereof, pyrogallol, fructose, ammonium thiosulfate, glycine, lactic acid, tetramethylguanidine, iminodiacetic acid, and dimethylacetoacetamide, trihydroxybenzene, dihydroxybenzene, and salicylhydroxamic acid.

7. The photoresist or semiconductor manufacturing residue stripping and cleaning composition of claim 1 wherein said one or more alkaline compounds are said one or more alkanolamines selected from the group consisting of ethanolamine, N-methyl ethanolamine, N-ethyl ethanolamine, N-propyl ethanolamine, N-butyl ethanolamine, N-methyl isopropanol amine, N-ethyl-isopropanol amine, N-propyl isopropanol amine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutan-1-ol, N-methyl-2-aminobutane-1-ol, N-ethyl-2-aminobutane-1-ol, N-hydroxymethyl ethanol amine, N-hydroxymethyl ethylene diamine, N,N'-bis (hydroxymethyl) ethylene diamine, N-hydroxymethyl isopropanol amine, N-methylethanolamine (NMEA), monoethanolamine (MEA), diethanolamine, mono-, di- and tri-isopropanolamine, 2-(2-aminoethylamino) ethanol, 2-(2-aminoethoxy) ethanol, triethanolamine.

8. The photoresist or semiconductor manufacturing residue stripping and cleaning composition claim 1, wherein said alkaline compound further comprises one or more amines selected from the group consisting of morpholine, cyclohexylamine, piperidine alkylamines (where the alkyl group has 1 to 5 carbons) and alkylene diamines (having 1 to 5 carbons).

9. The photoresist or semiconductor manufacturing residue stripping and cleaning composition of claim 1, wherein said alkaline compound further comprises one or more hydroxylamines.

10. The photoresist or semiconductor manufacturing residue stripping and cleaning composition of claim 1, wherein said one or more antioxidant corrosion inhibitors comprises gallic acid or catechol or mixtures of gallic acid and catechol.

11. A process for removing a photoresist or residue on a silicon substrate comprising silicon, the process comprising the steps of: contacting said substrate with a stripping and cleaning effective amount of the composition of claim 1; permitting said stripping composition to contact said substrate for a stripping effective period of time; and removing the photoresist or the photoresist residues from said substrate, wherein said silicon of said silicon substrate is etched at a rate that is less than 1 Å/min.

12. The process of making the composition of claim 1, comprising the steps of combining water, one or more alkaline compounds, one or more antioxidant corrosion inhibitors in a container and adding oxygen-containing gas to said composition to form one or more oxidized products of one or more antioxidant corrosion inhibitors in said composition.

13. The process of claim 12 wherein said adding step is performed by bubbling oxygen-containing gas through said composition in said container.

14. A photoresist or semiconductor manufacturing residue stripping and cleaning composition comprising about 70 to 85% by weight of one or more alkaline compounds, wherein said alkaline compounds comprise one or more alkanolamines, about 0.5 to 10% by weight of one or more antioxidant corrosion inhibitors, 0.001 to 5% of one or more oxidation products of one or more antioxidants, and 9.9 to 28.99 wt. % water.

15. The photoresist or semiconductor manufacturing residue stripping and cleaning composition of claim 14, wherein said one or more alkaline compounds are selected from the group consisting of primary, secondary and tertiary alkanolamines having from 1 to 5 carbon atoms.

16. The photoresist or semiconductor manufacturing residue stripping and cleaning composition of claim 14, wherein said one or more alkaline compound further comprises one or more hydroxylamines.

* * * * *